(12) United States Patent
Adachi

(10) Patent No.: US 7,724,088 B2
(45) Date of Patent: May 25, 2010

(54) PUSH-PULL AMPLIFIER

(75) Inventor: Toshio Adachi, Tokyo (JP)

(73) Assignee: Asahi Kasei EMD Corporation, Tokyo (JP)

( * ) Notice: Subject to any disclaimer, the term of this patent is extended or adjusted under 35 U.S.C. 154(b) by 72 days.

(21) Appl. No.: 12/213,845

(22) Filed: Jun. 25, 2008

(65) Prior Publication Data

US 2009/0066416 A1 Mar. 12, 2009

(30) Foreign Application Priority Data

Sep. 11, 2007 (JP) ............................. 2007-235660
May 20, 2008 (JP) ............................. 2008-132168

(51) Int. Cl.
*H03F 3/26* (2006.01)
(52) U.S. Cl. ...................... 330/255; 330/264
(58) Field of Classification Search ................. 330/255, 330/264, 267
See application file for complete search history.

(56) References Cited

U.S. PATENT DOCUMENTS 6,084,476 A * 7/2000 Hamanishi et al. .......... 330/255

FOREIGN PATENT DOCUMENTS

| JP | 02-052510 | 2/1990 |
| JP | 2000-261262 | 6/2000 |
| JP | 2005-311865 | 11/2005 |

OTHER PUBLICATIONS

J. Babanezhad. "A Rail-to-Rail CMOS Op Amp", IEEE Journal of Solid-State Circuits, vol. 23, No. 6, Dec. 6, 1988, pp. 1414-1417.
Gray, et al. Analysis and Design of Analog Integrated Circuits (Second Edition), pp. 64-65, 1984.
Gray, et al. Analysis and Design of Analog Integrated Circuits (Fourth Edition), pp. 50-51, 2001.

* cited by examiner

*Primary Examiner*—Steven J Mottola
(74) *Attorney, Agent, or Firm*—Morgan, Lewis & Bockius LLP

(57) ABSTRACT

A push-pull amplifier includes a voltage inversion circuit 9 that uses an output of the differential amplifier 1 as an input signal, and includes a set of resistors 7a, 7b, and a differential amplifier 8 for inverting the polarity of the input signal, a level shifting circuit 3 that shifts the level of an output signal of the voltage inversion circuit 9 to a prescribed level, while inverting the polarity of the output signal, and an output amplifier circuit 4 that includes complementary transistors which are different from each other in polarity. The transistors are inputted with the above-mentioned input signal and the output signal of the level shifting circuit 3, respectively for carrying out push-pull amplification.

8 Claims, 5 Drawing Sheets

F I G. 4
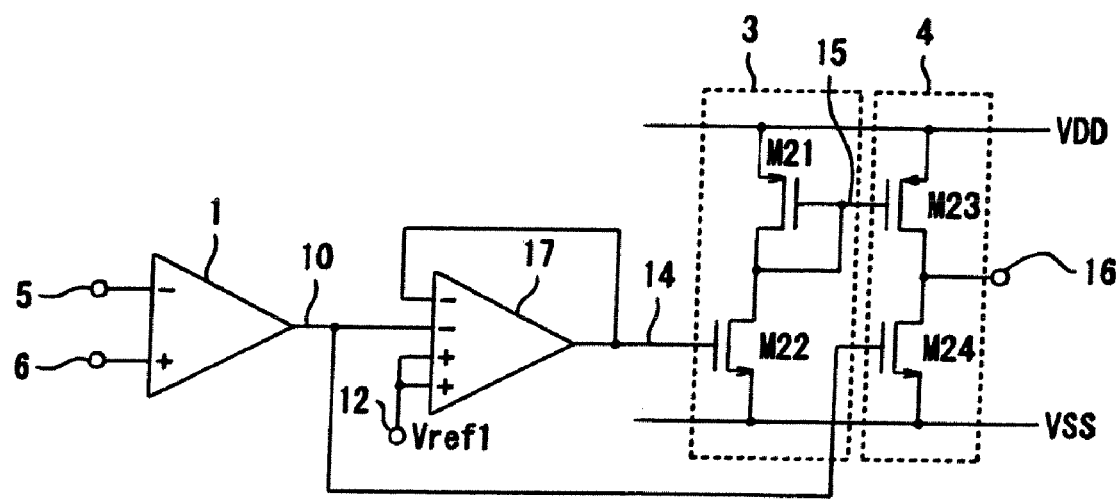

US 7,724,088 B2

PUSH-PULL AMPLIFIER

BACKGROUND OF THE INVENTION

1. Field of the Invention

The present invention relates to a push-pull amplifier which operates with low consumption current at no load, and has a high current driving capacity.

2. Description of the Related Art

Up to now, push-pull amplifiers having a great variety of configurations have been proposed, and they find their proper applications, based on the respective purposes, and the requirements for power supply voltage, and the like.

Among them, as the push-pull amplifier which operates at low voltage, the circuit as shown in FIG. 4 is known (referring to Japanese Patent Laid-Open No. 2005-311865). As shown in FIG. 4, this push-pull amplifier includes a differential amplifier circuit 1, a differential difference amplifier circuit 17, a level shifting circuit 3, and an output amplifier circuit 4. Further, this push-pull amplifier includes an inversion input terminal 5, a non-inversion input terminal 6, and an output terminal 16.

Generally, the push-pull amplifier is configured as an operational amplifier, including a differential amplifier circuit 1, however, it may lack the differential amplifier circuit 1, or include some other type of amplifier circuit. In this example of related art, the push-pull amplifier which is often used in general, including the differential amplifier circuit 1, will be described.

The differential amplifier circuit 1, which has the inversion input terminal 5 and the non-inversion input terminal 6, is a circuit which carries out differential amplification of an input signal fed to these both input terminals 5, 6. The output terminal 10 of this differential amplifier circuit 1 is connected to a first inversion input terminal of the differential difference amplifier circuit 17, and to the gate of an MOS transistor M24 in the output amplifier circuit 4.

The differential difference amplifier circuit 17 is a circuit which receives an output signal from the differential amplifier circuit 1 at the first inversion input terminal; inverts this received signal; and feeds the inverted signal to the gate of an MOS transistor M22 in the level shifting circuit 3 as an output signal.

Thus, the differential difference amplifier circuit 17 includes, besides the above-mentioned first inversion input terminal, a second inversion input terminal, a first non-inversion input terminal, a second non-inversion input terminal, and an output terminal 14, and the second inversion input terminal is connected to the output terminal 14. Further, the two non-inversion input terminals are connected to a reference voltage terminal 12, and to the respective non-inversion input terminals, a reference voltage Vref1 is supplied.

The level shifting circuit 3 is a circuit which carries out level shift of the output signal from the differential difference amplifier circuit 17, while inverting the output signal, and combines a P-type MOS transistor M21 with an N-type MOS transistor M22.

In other words, a power supply voltage VDD is supplied to the source of the MOS transistor M21, the gate and drain of which are commonly connected. And, the common connection is connected to the gate of the MOS transistor M23 in the output amplification section 4, and the drain of the MOS transistor M22, respectively. An output signal of the differential difference amplifier circuit 17 is fed to the gate of the MOS transistor M22, and to the source thereof, a power supply voltage VSS is supplied.

The output amplifier circuit 4 includes complementary MOS transistors M23, M24 which are different from each other in polarity, and the MOS transistors M23, M24 provide a circuit being inputted with an output signal of the level shifting circuit 3 and an output signal of the differential amplifier circuit 1 to make push-pull amplification operation.

In other words, the power supply voltage VDD is supplied to the source of the P-type MOS transistor M23, and the gate thereof is connected to an output terminal 15 of the level shifting circuit 3. The drain of the MOS transistor 23 is connected to the drain of the N-type MOS transistor M24, and the common connection therebetween is connected to the output terminal 16. Further, an output signal of the differential amplifier circuit 1 is fed to the gate of the MOS transistor M24, and to the source thereof, the power supply voltage VSS is supplied.

Next, an example of configuration of a circuit which is applicable to the differential difference amplifier circuit 17 will be described with reference to FIG. 5.

As shown in FIG. 5, the differential difference amplifier circuit includes a differential input section 31 including N-type MOS transistors M1, M2, M5; a differential input section 32 including N-type MOS transistors M3, M4, M6; and an adder section 33 including P-type MOS transistors M7 to M10 and N-type MOS transistors M11, M12 which adds the output of the differential input section 31 to the output of the differential input section 32. Herein, the MOS transistors M7, M8 are used as common loads for the differential input section 31 and the differential input section 32.

In addition, as shown in FIG. 5, this differential difference amplifier circuit includes a first non-inversion input terminal 34, a first inversion input terminal 35, a second inversion input terminal 36, a second non-inversion input terminal 37, and an output terminal 38.

More particularly, the MOS transistors M1, M2 form a differential pair, the gate of the MOS transistor M1 being connected to the first non-inversion input terminal 34, and the gate of the MOS transistor M2 being connected to the first inversion input terminal 35. The MOS transistors M3, M4 form a differential pair, the gate of the MOS transistor M3 being connected to the second inversion input terminal 36, and the gate of the MOS transistor M4 being connected to the second non-inversion input terminal 37.

The MOS transistor M5 functions as a constant current source for the MOS transistors M1, M2, and the MOS transistor M6 functions as a constant current source for the MOS transistors M3, M4. To that end, the respective gates of the MOS transistors M5, M6 are connected to a bias terminal 39, and to those respective gates, a prescribed bias voltage is supplied.

The respective gates of the MOS transistors M7, M8 are connected to a bias terminal 40, and to those respective gates, a prescribed bias voltage is supplied. In addition, the respective gates of the MOS transistors M9, M10 are connected to a bias terminal 41, and to those respective gates, a prescribed bias voltage is supplied. Further, the MOS transistor M11, M12 constitute a current mirror circuit.

Next, as shown in FIG. 5, the operation of the differential difference amplifier circuit will be described.

Now, let's assume that, as shown in FIG. 5, in the differential difference amplifier circuit, an input voltage V1, V2 is supplied to the input terminal 34, 35, while an input voltage V4, V3 is supplied to the input terminal 36, 37, respectively. In addition, assuming that the output voltage of the output terminal 38 is VOUT, the relationship among these voltages can be expressed by the following equation:

$$VOUT = A1(V1-V2) + A2(V3-V4) \quad (1)$$

where A1 in Eq. (1) is the gain from the input terminal 34, 35 to the output terminal 38, and A2 is the gain from the input terminal 36, 37 to the output terminal 38.

Now, let's assume that the respective sizes of the MOS transistors M1 to M4 are the same, and the respective sizes of the MOS transistors M5, M6 are the same, then the gains A1, A2 will be equal to each other, thus A1=A2=A becomes true, which allows Eq. (1) to be rearranged into the following Eq. (2):

$$VOUT = A(V1-V2+V3-V4) \quad (2)$$

Herein, if the gain for the differential difference amplifier circuit is large enough, V1−V2+V3−V4=0 becomes true from Eq. (2), provided the differential difference amplifier circuit is used in a feedback circuit. If this relationship is applied to the output signal of the differential difference amplifier circuit 17 in FIG. 4, the relationship expressed by the following Eq. (3) is obtained.

$$V14 = 2 \times Vref1 - V10 \quad (3)$$

where V10 is the voltage at the output terminal 10 of the differential amplifier circuit 1, and V14 is the voltage at the output terminal 14 of the differential difference amplifier circuit 17.

From Eq. (3), it can be seen that the output voltage V14 for the differential difference amplifier circuit 17 is an inversion of the input voltage for the differential difference amplifier circuit 17. In addition, the voltage V15 at the output terminal 15 in the level shifting circuit 3 is an inversion of the voltage V14 at the output terminal 14 in the differential difference amplifier circuit 17.

Now, assuming that the voltage V10 at the output terminal 10 of the differential amplifier circuit 1 is a sine wave voltage, then the relationship among the respective waveforms for the voltages V10, V14, V15 at the terminals 10, 14, 15 is as shown in FIG. 6.

In FIG. 6, reference sign D denotes a waveform for the voltage V10 at the output terminal 10 of the differential amplifier circuit 1. The waveform E represents the voltage at the terminal 14, and as can be seen from Eq. (3), it provides an inversion signal as a result of the voltage V10 being inverted. In other words, it can be said that the differential difference amplifier circuit 17 is inputted with the signal D, and inverts it to generate the signal E.

Herein, the signal E at the output terminal 14 of the differential difference amplifier circuit 17 is shifted from the reference level Vref1 to the reference level Vref2 by the level shifting circuit 3, while further being inverted to become a signal F. The polarity of the signal F is the same as the polarity of the signal D as a result of the reinversion.

As a result of such an action of the level shifting circuit 3, in the case where current is to be supplied from the output terminal 16 to the side of the low power supply voltage VSS, the signal level at the terminal 10 is shifted to a level higher than the reference level Vref1. This corresponds to a situation in the vicinity of an arrow 50 in FIG. 6.

Then, the gate voltage for the MOS transistor M24 is increased, which allows more current to be conducted, and on the other hand, the gate voltage for the MOS transistor M23 is increased, which acts so as to reduce the current flow therethrough, resulting in the current conduction in the MOS transistor M24 being promoted.

Conversely, in the case where current is to be supplied from the side of the high power supply voltage VDD to the output terminal 16, the signal level at the terminal 10 is shifted to a level lower than the reference level Vref1. This corresponds to a situation in the vicinity of an arrow 51 in FIG. 6.

Then, the gate voltage for the MOS transistor M24 is decreased, and thus more current can be supplied to the output terminal 16 by the quantity of current flow that has been reduced, and on the other hand, the gate voltage for the MOS transistor M23 is decreased, which allows more current to be conducted.

In this way, the push-pull amplifier circuit acts such that, when one of the output transistors M23, M24 conducts much current, the other transistor acts so as to suppress the quantity of current conducted, or shut off the current. On such a principle, in the case where there is the need for flowing much current, the push-pull amplifier circuit can make the desired operation while suppressing the consumption current.

In order to allow the output MOS transistor M23, M24 to drive a higher output current, the level of the signal to be applied to the gate of the MOS transistor M23, M24 can be increased. For example, for the MOS transistor M24, the peak level of the signal waveform D in FIG. 6 can be increased.

However, if the peak level of the signal waveform D is increased with respect to Vref1, the difference in voltage from the signal waveform E at a peak is increased. In this case, if a signal which level is high enough to turn off any of the input transistors M1 to M4 in the differential difference amplifier 17 is applied, the differential difference amplifier circuit 17 will not perform the computation as explained with Eq. (2), thus the signal waveform D will not reach a higher level. In order to solve this problem, the overdrive voltage (Vgs−Vth) for the MOS transistors M1 to M4 can be increased, however, the possible range of such increase has been limited.

Therefore, the present invention has been made in consideration of the above-mentioned situation, and the purpose thereof is to provide a push-pull amplifier which, without depending on the overdrive voltage, can increase the peak value of the gate voltage for the output transistor to a level still higher than the conventional one, and is capable of producing an output current with low consumption current that is higher than that available with conventional push-pull amplifiers.

SUMMARY OF THE INVENTION

In order to solve the above-mentioned problems to achieve the purpose of the present invention, the respective inventions according to the claims have been configured as follows:

The invention according to claim 1 provides a push-pull amplifier, comprising a voltage inversion circuit which includes a set of resistors and a differential amplifier for inverting the polarity of an input signal; a level shifting circuit which shifts the level of an output signal of the voltage inversion circuit to a prescribed level, while carrying out inversion of the polarity of the output signal; and an output amplifier circuit which includes complementary transistors different in polarity from each other, the transistors being inputted with the input signal and an output signal of the level shifting circuit, respectively, for carrying out push-pull amplification.

In accordance with the invention according to claim 2, in the invention according to claim 1, the voltage inversion circuit comprises a first resistor and a second resistor forming the set of resistors, and the differential amplifier; from one end of the first resistor, the input signal is inputted, and the other end of the first resistor is connected to one end of the second resistor and an inversion input terminal of the differential amplifier, respectively; the other end of the second resistor is connected to an output terminal of the differential amplifier; and to a non-inversion input terminal of the differential amplifier, a reference voltage is applied, and from the output terminal of the differential amplifier, an output signal resulting from the polarity of the input signal having been inverted is outputted.

In accordance with the invention according to claim 3, in the invention according to claim 1, the level shifting circuit comprises an N-type MOS transistor and a P-type MOS transistor, which are complementary MOS transistors different in polarity from each other; to a gate terminal of one MOS transistor of the complementary MOS transistors, an output signal of the voltage inversion circuit is inputted, and to a source terminal thereof, a first power supply voltage is supplied; to a source terminal of the other MOS transistor of the complementary MOS transistors, a second power supply voltage is supplied; and a gate terminal thereof and a drain terminal thereof are commonly connected, being connected to the drain terminal of the one MOS transistor; from the common connection, an output signal resulting from the level of the output signal of the voltage inversion circuit having been shifted to a prescribed level while the polarity thereof being inverted is outputted.

In accordance with the invention according to claim 4, in the invention according to claim 1, the output amplifier circuit, wherein the complementary transistors are an N-type MOS transistor and a P-type MOS transistor, which are complementary transistors different in polarity from each other; to a gate terminal of one MOS transistor of the complementary MOS transistors, the input signal is inputted, and to a source terminal thereof, a first power supply voltage is supplied; to a source terminal of the other MOS transistor of the complementary MOS transistors, a second power supply voltage is supplied; to a gate terminal thereof, an output signal of the level shifting circuit is inputted; and a drain terminal of the MOS transistor is connected to a drain terminal of the one MOS transistor; using the common connection between the drain terminal of the one MOS transistor and the drain terminal of the other MOS transistor as an output terminal, outputs an output signal resulting from push-pull amplification having been carried out.

In accordance with the invention according to claim 5, in the invention according to claim 1, a voltage buffer amplifier is provided at the previous stage of the voltage inversion circuit, wherein the input signal is inputted to the voltage inversion circuit through the voltage buffer amplifier.

In accordance with the invention according to claim 6, in the invention according to claim 5, the voltage buffer amplifier provides input/output rail-to-rail operation.

In accordance with the invention according to claim 7, in the invention according to claim 6, the voltage buffer amplifier comprises a first differential circuit in which input transistors are P-type MOS transistors, and a second differential circuit in which input transistors are N-type MOS transistors; in the case where the level of the input signal is on the side of a positive power supply voltage, the second differential circuit is activated, while, in the case where the level of the input signal is on the side of a negative power supply voltage, the first differential circuit is activated, and in the case where the level of the input signal is in the vicinity of the middle point between the positive power supply voltage and the negative power supply voltage, the first and second differential circuits are activated.

In accordance with the invention according to claim 8, in the invention according to claim 2, a reference voltage generator circuit for generating a reference voltage is provided and has a MOS transistor which has a same polarity as a polarity of a MOS transistor of which an input signal is inputted into a gate among the complementary MOS transistors different in polarity from each other, in which a gate terminal of this MOS transistor and a drain terminal are commonly connected together and form a commonly connecting part, wherein a constant current is supplied to the commonly connecting part, and the reference voltage is generated in the commonly connecting part.

According to the present invention comprising such a configuration, a push-pull amplifier which is capable of operating with low consumption current, and avoiding that the MOS transistor is turned off, and thus has a driving current capacity greater than that of conventional push-pull amplifiers can be provided.

BRIEF DESCRIPTION OF THE DRAWINGS

FIG. 4 is a circuit diagram for one example of the conventional push-pull amplifier;

DETAILED DESCRIPTION OF THE PREFERRED EMBODIMENTS

Hereinbelow, embodiments of the present invention will be described with reference to the drawings.

First Embodiment

Figure 1:
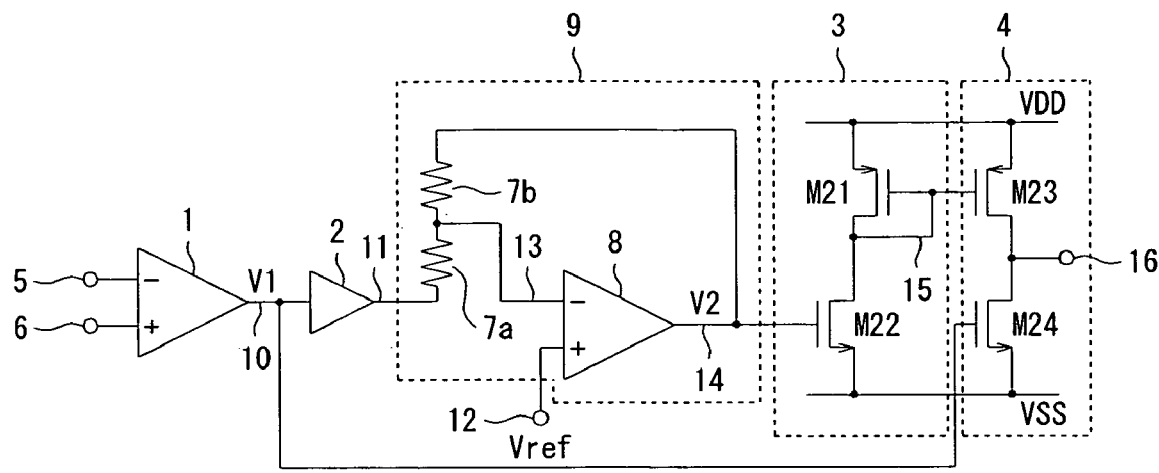
FIG. 1 is a block diagram illustrating the entire configuration of a first embodiment of a push-pull amplifier of the present invention.

FIG. 1 is a block diagram illustrating a configuration of a first embodiment of a push-pull amplifier of the present invention.

As shown in FIG. 1, the first embodiment includes a differential amplifier 1; a voltage buffer amplifier 2; a voltage inversion circuit 9 including a set of resistors 7a, 7b and a differential amplifier 8; a level shifting circuit 3 including transistors M21, M22; an output amplifier circuit 4 including transistors M23, M24; an inversion input terminal 5; a non-inversion input terminal 6; an output terminal 16; and a reference voltage terminal 12.

Generally, the push-pull amplifier is configured as an operational amplifier, having a differential amplifier 1, however, it may lack the differential amplifier 1, or have some other type of amplifier. In this embodiment, the push-pull amplifier having a differential amplifier 1, which is of a type often used in general, will be described.

The differential amplifier 1 has an inversion input terminal (−) 5, a non-inversion input terminal (+) 6, and an output terminal 10, with the output terminal 10 being connected to an input terminal of the voltage buffer amplifier 2 and a gate terminal of the transistor M24.

The voltage buffer amplifier 2 has an input terminal connected to the output terminal 10 of the differential amplifier 1, and an output terminal 11, making impedance adjustment. The output terminal 11 of the voltage buffer amplifier 2 is connected to one terminal of the resistor 7a.

The voltage inversion circuit 9 is a circuit being inputted with an output signal from the voltage buffer amplifier 2 as an input signal for inverting the polarity of the input signal, including a set of resistors 7a, 7b, and a differential amplifier 8. Specifically, an output signal of the voltage buffer amplifier 2 is inputted to one end of the resistor 7a as an input signal, and the other end of the resistor 7a is connected to one end of the resistor 7b and an inversion input terminal (−) 13 of the differential amplifier 8, respectively. The other end of the resistor 7b is connected to an output terminal 14 of the differential amplifier 8. And, to the non-inversion input terminal (+) 12 of the differential amplifier 8, a reference voltage Vref is applied, and from the output terminal 14 of the differential amplifier 8, an output signal is provided whose polarity is inverted with respect to that of the above-mentioned input signal.

The level shifting circuit 3 is a circuit which carries out level shift of the output signal from the differential amplifier 8, while inverting the output signal. The level shifting circuit 3 combines the P-type MOS transistor M21 with the N-type MOS transistor M22 of a complementary type which are different in polarity from each other.

In other words, a power supply voltage VDD is supplied to the source of the MOS transistor M21, the gate and drain of which are commonly connected. And, the common connection is connected to the gate of the MOS transistor M23 in the output amplification section 4, and the drain of the MOS transistor M22, respectively. An output signal of the differential amplifier 8 is fed to the gate of the MOS transistor M22, and to the source thereof, a power supply voltage VSS is supplied.

The output amplification section 4 includes complementary MOS transistors M23, M24 which are different from each other in polarity, and the MOS transistors M23, M24 provide a circuit being inputted with an output signal of the level shifting circuit 3 and an output signal of the differential amplifier 1 to make push-pull amplification operation.

In other words, the power supply voltage VDD is supplied to the source of the P-type MOS transistor M23, and the gate thereof is connected to the output terminal 15 of the level shifting circuit 3. The drain of the MOS transistor M23 is connected to the drain of the N-type MOS transistor M24, and the common connection therebetween is connected to the output terminal 16. Further, an output signal of the differential amplifier 1 is fed to the gate of the MOS transistor M24, and to the source thereof, the power supply voltage VSS is supplied.

Next, a specific example of a circuit of the differential amplifier 1 will be described with reference to FIG. 2.

Figure 2:
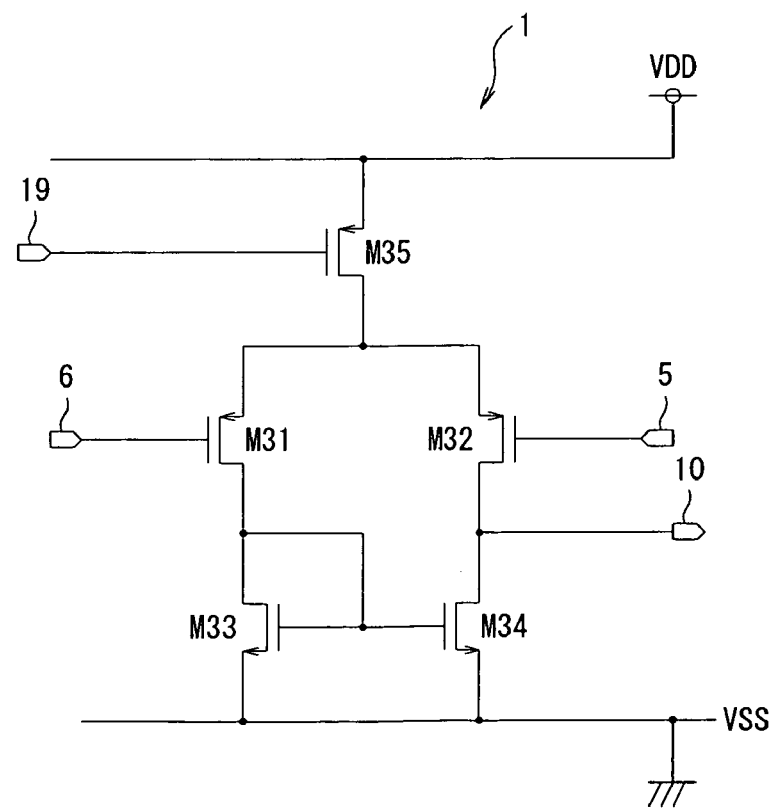
FIG. 2 is a circuit diagram illustrating a circuit used in the differential amplifier as shown in FIG. 1.

As shown in FIG. 2, the differential amplifier 1 includes P-type MOS transistors M31, M32 forming a differential pair; a current mirror circuit including N-type MOS transistors M33, M34 that function as a current source for flowing a constant current to the MOS transistors M31, M32, respectively, while functioning as an active load; and a P-type-MOS transistor M35 which functions as a current source for supplying a constant current to the MOS transistors M31, M32.

In addition, the differential amplifier 1 has an inversion input terminal 5, a non-inversion input terminal 6, and an output terminal 10, and these respective terminals correspond to the respective terminals of the differential amplifier 1 as shown in FIG. 1. Further, the differential amplifier 1 has a bias terminal 19 which is connected to the gate of the MOS transistor M35. FIG. 2 gives a typical example of a circuit of differential amplifier, however, various circuits of differential amplifiers are known, and in this embodiment, any of such differential amplifiers may be used.

Next, the operation of the push-pull amplifier having a configuration as shown in FIG. 1 will be described.

The voltages at the output terminal 10 of the differential amplifier 1, at the non-inversion input terminal (+) 12 of the differential amplifier 8, and at the output terminal 14 of the differential amplifier 8 are referred to as V1, Vref, and V2, respectively. Then, the voltage at the output terminal 11 of the voltage buffer amplifier 2 is V1, which is the same as the voltage at the output terminal 10 of the differential amplifier 1.

In the case where the resistor values of the set of resistors 7a, 7b are the same, the voltage at the inversion input terminal 13 of the differential amplifier 8 is (V1+V2)/2, which is a mean value between the voltage V1 at the output terminal 11 of the voltage buffer amplifier 2 and the voltage V2 at the output terminal 14 of the differential amplifier 8.

Herein, because the differential amplifier 8 forms a negative feedback loop through the resistor 7b, the voltage at the non-inversion input terminal 12 and the voltage at the inversion input terminal 13 are equal, the following Eq. (4) becoming true.

$$Vref=(V1+V2)/2 \qquad (4)$$

With the Eq. (4) modified, the output voltage V2 of the differential amplifier 8 can be expressed by the following Eq. (5):

$$V2=2\times Vref-V1 \qquad (5)$$

According to this Eq. (5), when the voltage V1 at the output terminal 10 of the differential amplifier 1 is increased, resulting in the current for the MOS transistor M24 being increased, the voltage V2 at the output terminal 14 of the differential amplifier 8 will be decreased, with the current for the MOS transistor M22 being reduced, and by the current mirror action, the current for the MOS transistor M23 is decreased. Conversely, when the voltage V1 at the output terminal 10 of the differential amplifier 1 is lowered, resulting in the current for the MOS transistor M24 being reduced, the voltage V2 at the output terminal 14 of the differential amplifier 8 will be increased, and thus the current for the MOS transistor M23 increases.

The requirement for the circuit in FIG. 1 to normally function even at a low power supply voltage can satisfy Eq. (5) if the voltage buffer amplifier 2 and the differential amplifier 8 normally function. Especially, because there is a high possibility that the signal level at the output terminal 10 of the differential amplifier 1 may greatly fluctuate between the power supply voltage VSS and the power supply voltage VDD, it is preferable that the voltage buffer amplifier 2 provide input/output rail-to-rail operation, and that the differential amplifier 8 operate in the vicinity of Vref, the reference voltage, as an input signal operation range. As the voltage buffer amplifier 2 which provides rail-to-rail operation, a circuit as shown in FIG. 3 is often used in general.

Figure 3:
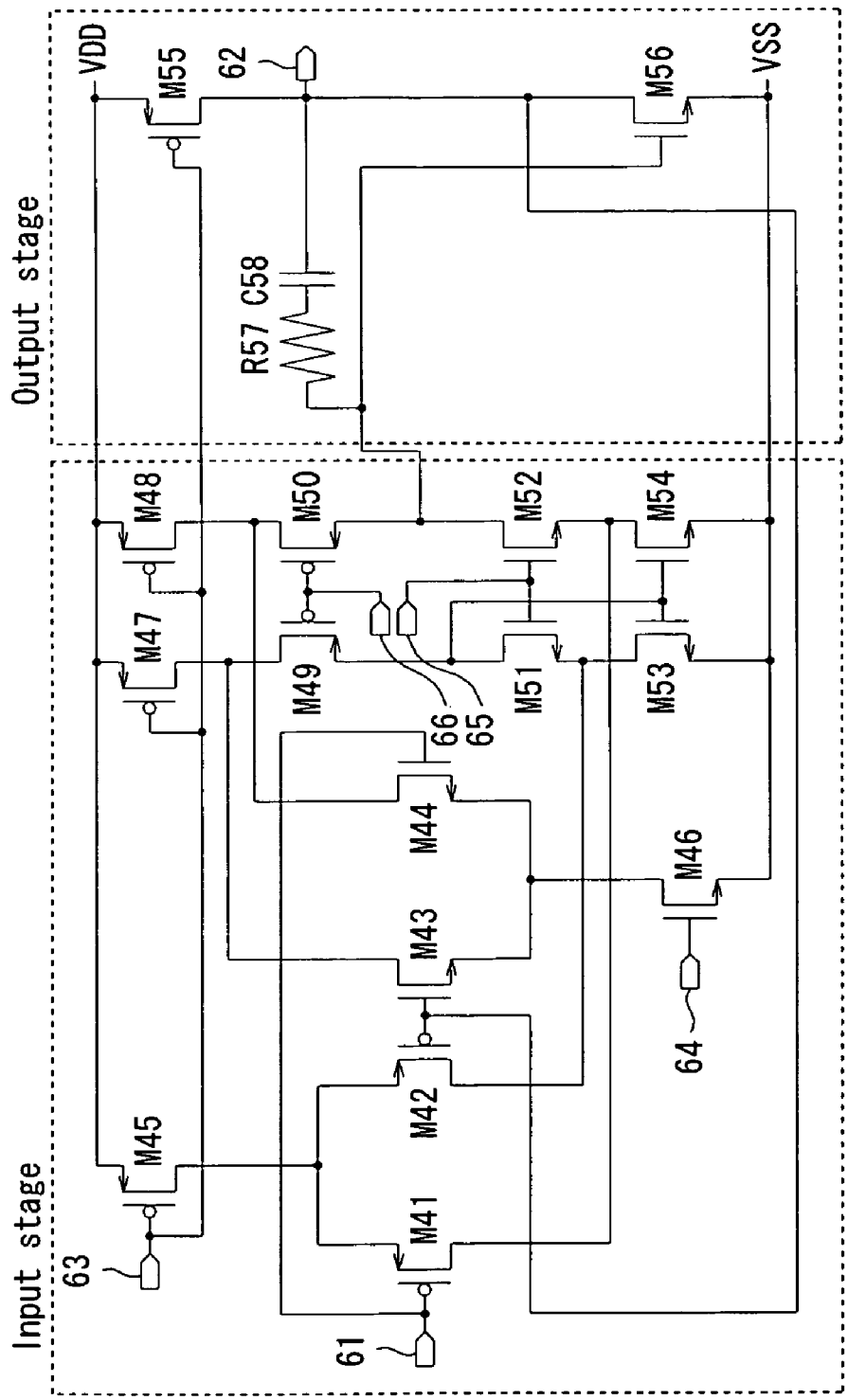
FIG. 3 is a circuit diagram illustrating a circuit used in the voltage buffer amplifier as shown in FIG. 1.
Figure 5:
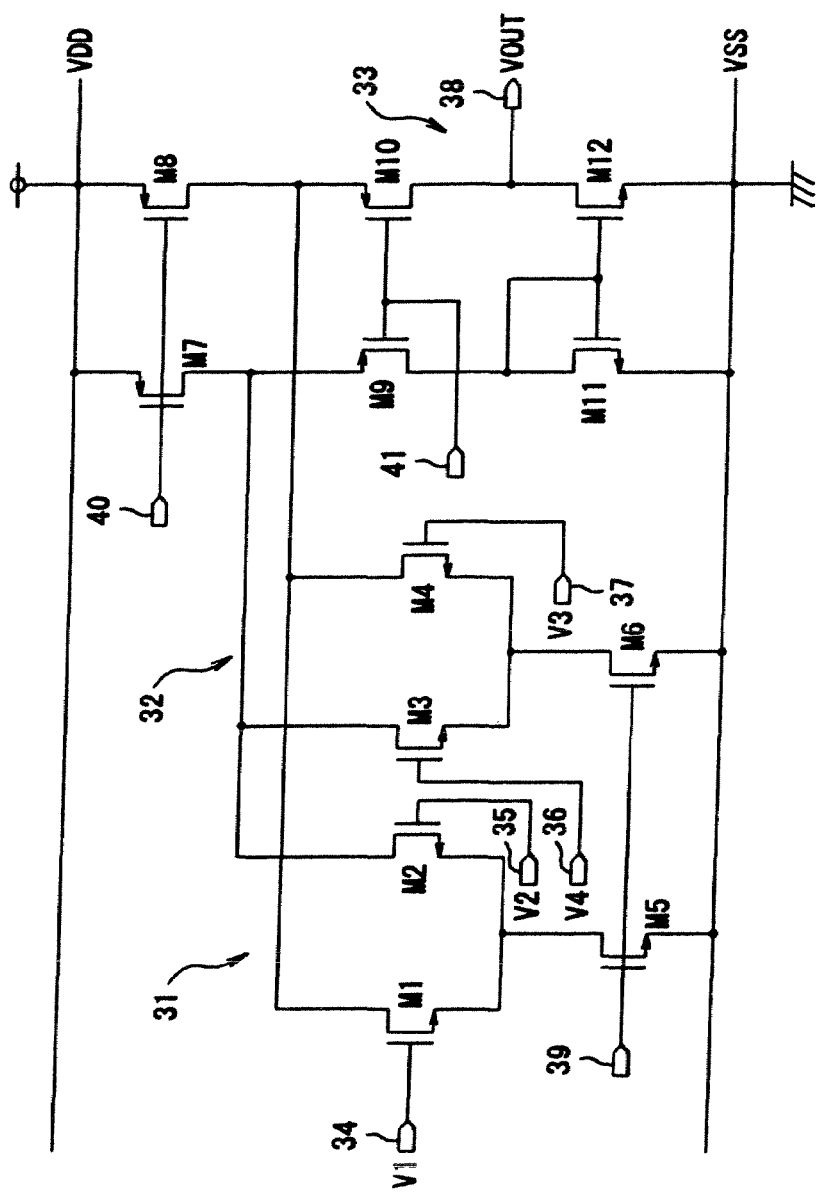
FIG. 5 is a circuit diagram of a specific example of a circuit which is applicable to the differential difference amplifier circuit as shown in FIG. 4.
Figure 6:
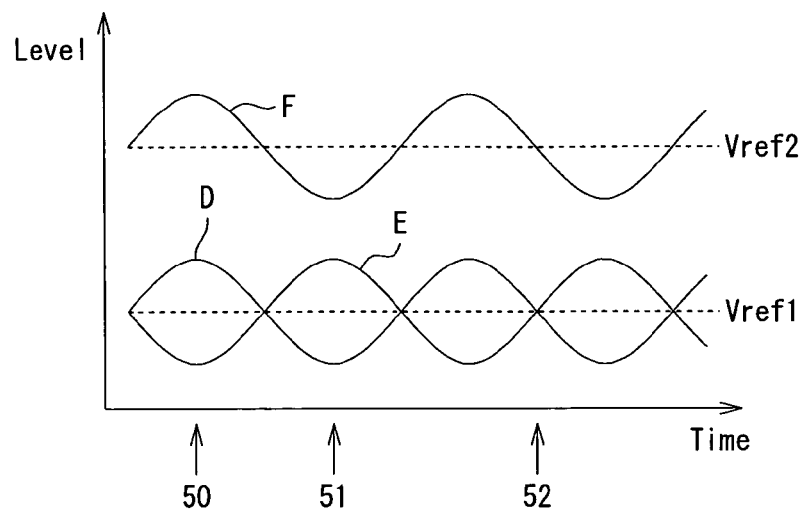
FIG. 6 is a waveform diagram illustrating an example of waveform for respective parts of the circuit in FIG. 4.

The voltage buffer amplifier in FIG. 3 includes a first differential circuit including input transistors M41, M42 of PMOS and a transistor M45 which functions as a current source; a second differential circuit including input transistors M43, M44 of NMOS and a transistor M46 which functions as a current source; a current synthesizing circuit including MOS transistors M47, M48, M49, M50, M51, M52, M53, M54; an output circuit including MOS transistors M55, M56; and a phase compensation circuit including a resistor R57 and a capacitance C58.

In addition, the voltage buffer amplifier in FIG. 3 has a non-inversion input terminal 61 to which an input signal is fed; an output terminal 62 from which an output signal is drawn; and bias terminals 63 to 66 to which a prescribed bias voltage is applied.

According to the circuit having such a configuration, in the case where the input signal level is on the VDD side, the second differential circuit in which the input transistors are of NMOS operates; conversely in the case where the input signal level is on the VSS side, the first differential circuit in which the input transistors are of PMOS operates; and in the case where the input signal level is in the vicinity of the middle of VDD and VSS, both differential circuits will operate. In this way, because two sets of differential circuits are provided, the input signal level is being capable of activating in a range of the voltage from one power supply to another power supply.

As a result of this, the circuit in FIG. 1 will operate independently of the value of the overdrive voltage (Vgs−Vth) for the MOS transistor, thus it can be operated at a lower power supply voltage.

In the first embodiment as shown in FIG. 1, the voltage buffer amplifier 2 is used, however, in the case where the output impedance for the differential amplifier 1 is sufficiently low, as compared to the resistor 7a, 7b, the voltage buffer amplifier 2 can be omitted with the requirement for high current driving capacity at low voltage being satisfied.

Second Embodiment

With a push-pull amplifier according to the first embodiment as shown in FIG. 1, in the case where the power supply voltage fluctuation, the ambient temperature fluctuation, and further the manufacturing process fluctuation are not so large, the current at no load flowing in the output transistor can be set in the vicinity of a certain design value. However, in the case where the above-mentioned fluctuations are large, the current at no load flowing in the output transistor will greatly fluctuate.

Figure 7:
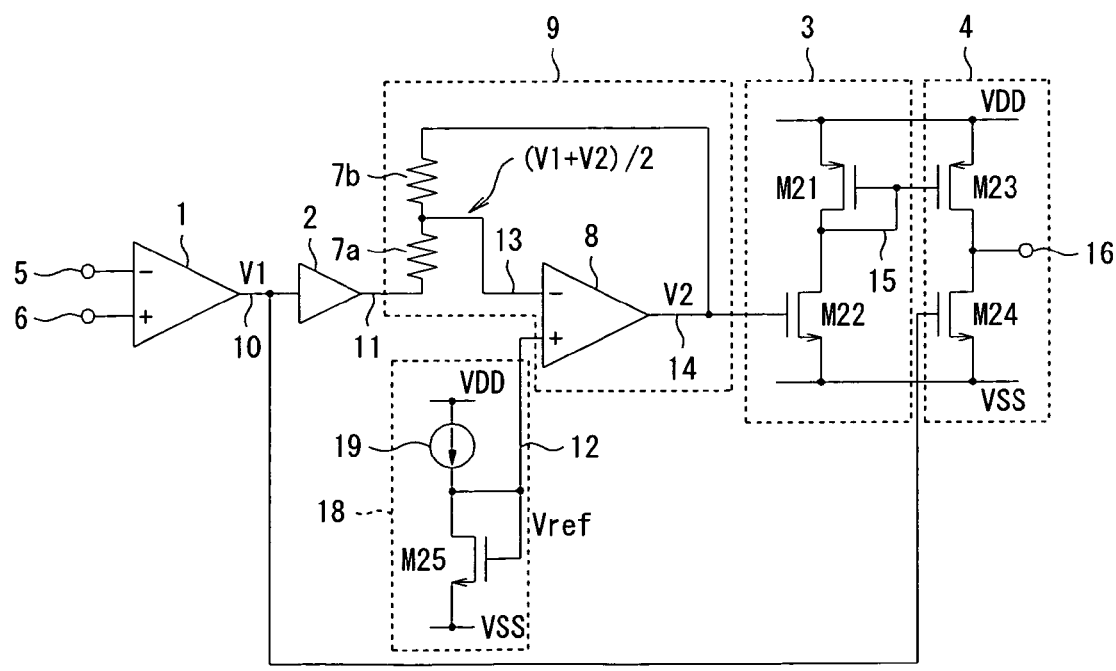
FIG. 7 is a block diagram illustrating the entire configuration of a second embodiment of a push-pull amplifier of the present invention.

Then, by using a circuit as shown in FIG. 7, a push-pull amplifier according to a second embodiment has been adapted to be capable of rendering constant the consumption current at no load constant, independently of the power supply voltage, the manufacturing process, and the ambient temperature.

In other words, the second embodiment is based on the configuration of the first embodiment as shown in FIG. 1, adding thereto a reference voltage generator circuit 18 for generating a reference voltage Vref, as shown in FIG. 7. Therefore, the components as those in FIG. 1 are provided with the same reference numerals and signs, and the explanation thereof will be omitted whenever possible.

The reference voltage generator circuit 18 includes an N-type MOS transistor M25 and a current source 19 which supplies a constant current. The MOS transistor M25 has the same polarity as the MOS transistor M24 constituting the output amplifier circuit 4.

Specifically, the gate and drain of the N-type MOS transistor M25 are commonly connected, being connected to a terminal 12, which is connected to the non-inversion input terminal of the differential amplifier 8. To the source of the N-type MOS transistor M25, a negative power supply voltage VSS is supplied. To one terminal of the current source 19, a positive power supply voltage VDD is supplied, and the other terminal of the current source 19 is connected to the terminal 12.

Next, in the second embodiment as shown in FIG. 7, how the consumption current at no load can be rendered constant, independently of the power supply voltage, the manufacturing process, and the ambient temperature will be described.

Let's assume that the current mirror ratio for the P-type MOS transistors M21, M23 constituting a current mirror circuit in FIG. 7 is 1:B. This assumption is equivalent to saying that the size ratio for the P-type MOS transistors is 1:B. In addition, the transistor size of the N-type MOS transistors M22, M24, M25 is assumed to be (W/L), A(W/L), C(W/L), respectively.

In the case where no output load is imposed, no current flows into the output terminal, thus the currents which are carried by the MOS transistors M23 and M24 are the same, and similarly the currents which are carried by the MOS transistors M21 and M22 are the same. Assuming that the current flowing through the MOS transistors M22, M24, M25 is I22, I24, I25, respectively, the following equations can be given (referring to p. 50 of "Anarogu Shuhseki-Kairo Sekkei-Gijutsu (in Japanese)" 1st vol. published by BAIFUKAN CO., LTD., Tokyo, which is a book translated under the supervision of Kunihiro Asada and Yuzuru Nagata of "Analysis and Design of Analog Integrated Circuits", 4th ed., John Wiley & Sons, New York, 2001, by P. R. Gray, P. J. Hurst, S. H. Levis, and R. G. Meyer).

$$I22=(W/L)K'(V2-Vth)^2 \qquad (6)$$

$$I24=A(W/L)K'(V1-Vth)^2 \qquad (7)$$

$$I25=C(W/L)K'(Vref-Vth)^2 \qquad (8)$$

where Vth is a threshold voltage of each of the MOS transistors, and K' is a value which can be expressed by the equation $K'=\mu Cox/2$, where Cox is a gate oxide film thickness, and $\mu$ is a carrier mobility.

From Eqs. (6) to (8), the gate voltage V2, V1, Vref for the N-type MOS transistor M22, M24, M25 can be expressed as follows, respectively:

$$V2=\sqrt{(I22/(W/L)K')}+Vth \qquad (9)$$

$$V1=\sqrt{(I22/A(W/L)K')}+Vth \qquad (10)$$

$$Vref=\sqrt{(I25/C(W/L)K')}+Vth \qquad (11)$$

Because the current mirror ratio for the P-type MOS transistors M22, M24 is 1:B, the relationship between I22 and I24 is:

$$I24=B \cdot I22 \qquad (12)$$

Substituting Eq. (12) into Eq. (9), the following Eq. (13) is given.

$$V2=\sqrt{(1/B)}\sqrt{(I24/(W/L)K')}+Vth \qquad (13)$$

The relationship among the voltage Vref which is supplied to the non-inversion input terminal 12 of the differential amplifier 8, and the input voltage V1 and the output voltage V2 for the voltage inversion circuit 9 can be expressed by Eq. (14), provided the resistor value of the resistor 7a is identical to that of the resistor 7b.

$$(V2+V1)/2=Vref \qquad (14)$$

Into Eq. (14), substituting Eqs. (10), (11), and (13) will give Eq. (15):

$$\sqrt{(I24/(W/L)K')}\{(1/B)+\sqrt{(1/A)}\}/2+Vth=\sqrt{(I25/C(W/L)K')}+Vth \qquad (15)$$

Eq. (15) is rearranged to give Eq. (16):

$$I24=4 \cdot I25/C\{\sqrt{(1/B)}+\sqrt{(1/A)}\}^2 \qquad (16)$$

In the case where, as the current I25 for the current source 19 that is to be supplied to the MOS transistor M25, a constant current which is generated from, for example, a reference voltage independent of the power supply voltage is used, the current I24 which is carried by the output transistor M24 can be determined, from Eq. (16), using the current I25, and the size ratios A, B, and C, for the MOS transistors, and yet the value of the current I24 is always constant, regardless of the power supply voltage, the process conditions, and the ambient temperature.

If the size ratio B between the P-type MOS transistors M21 and M23 is equal to the size ratio A between the N-type MOS transistors M22 and M24 (i.e., A=B), Eq. (16) can be expressed by a simple equation, Eq. (17):

$$I24 = I25 \cdot A/C \qquad (17)$$

In this way, the second embodiment of the push-pull amplifier of the present invention features that it can supply a large output current at a low voltage as well as with a low consumption current, and that, because the reference voltage generator circuit 18 as shown in FIG. 7 is used in the inversion circuit, the current I25 from the current source 19 being constant, independent of the power supply voltage, the consumption current at no load can be rendered constant, independently of the power supply voltage, the manufacturing process, and the ambient temperature.

The push-pull amplifier of the present invention employs a voltage inversion circuit using resistors and a level shifter circuit, thus it provides an effect that it can suppress the consumption current at no load while having a high current driving capacity, independently of the overdrive voltage for the MOS transistor.

What is claimed is:

1. A push-pull amplifier, comprising:
a voltage inversion circuit which includes a set of resistors and a differential amplifier for inverting the polarity of an input signal;
a level shifting circuit which shifts the level of an output signal of the voltage inversion circuit to a prescribed level, while carrying out inversion of the polarity of the output signal; and
an output amplifier circuit which includes complementary transistors different in polarity from each other, the transistors being inputted with the input signal and an output signal of the level shifting circuit, respectively, for carrying out push-pull amplification.

2. The push-pull amplifier according to claim 1, wherein the voltage inversion circuit comprises:
a first resistor and a second resistor forming the set of resistors, and
the differential amplifier;
from one end of the first resistor, the input signal is inputted, and the other end of the first resistor is connected to one end of the second resistor and an inversion input terminal of the differential amplifier, respectively;
the other end of the second resistor is connected to an output terminal of the differential amplifier; and
to a non-inversion input terminal of the differential amplifier, a reference voltage is applied, and from the output terminal of the differential amplifier, an output signal resulting from the polarity of the input signal having been inverted is outputted.

3. The push-pull amplifier according to claim 1, wherein the level shifting circuit comprises:
an N-type MOS transistor and a P-type MOS transistor, which are complementary MOS transistors different in polarity from each other;
to a gate terminal of one MOS transistor of the complementary MOS transistors, an output signal of the voltage inversion circuit is inputted, and to a source terminal thereof, a first power supply voltage is supplied;
to a source terminal of the other MOS transistor of the complementary MOS transistors, a second power supply voltage is supplied; and a gate terminal thereof and a drain terminal thereof are commonly connected, being connected to the drain terminal of the one MOS transistor;
from the common connection, an output signal resulting from the level of the output signal of the voltage inversion circuit having been shifted to a prescribed level while the polarity thereof being inverted is outputted.

4. The push-pull amplifier according to claim 1, wherein the output amplifier circuit, wherein
the complementary transistors are an N-type MOS transistor and a P-type MOS transistor, which are complementary transistors different in polarity from each other;
to a gate terminal of one MOS transistor of the complementary MOS transistors, the input signal is inputted, and to a source terminal thereof, a first power supply voltage is supplied;
to a source terminal of the other MOS transistor of the complementary MOS transistors, a second power supply voltage is supplied; to a gate terminal thereof, an output signal of the level shifting circuit is inputted; and a drain terminal of the MOS transistor is connected to a drain terminal of the one MOS transistor;
using the common connection between the drain terminal of the one MOS transistor and the drain terminal of the other MOS transistor as an output terminal, outputs an output signal resulting from push-pull amplification having been carried out.

5. The push-pull amplifier according to claim 1, comprising a voltage buffer amplifier at the previous stage of the voltage inversion circuit, wherein the input signal is inputted to the voltage inversion circuit through the voltage buffer amplifier.

6. The push-pull amplifier according to claim 5, wherein the voltage buffer amplifier provides input/output rail-to-rail operation.

7. The push-pull amplifier according to claim 6, wherein the voltage buffer amplifier comprises a first differential circuit in which input transistors are P-type MOS transistors, and a second differential circuit in which input transistors are N-type MOS transistors;
in the case where the level of the input signal is on the side of a positive power supply voltage, the second differential circuit is activated, while, in the case where the level of the input signal is on the side of a negative power supply voltage, the first differential circuit is activated, and in the case where the level of the input signal is in the vicinity of the middle point between the positive power supply voltage and the negative power supply voltage, the first and second differential circuits are activated.

8. The push-pull amplifier according to claim 2,
comprising a reference voltage generator circuit for generating a reference voltage, wherein the reference voltage generator circuit has a MOS transistor which has a same polarity as a polarity of a MOS transistor of which an input signal is inputted into a gate among the complementary MOS transistors different in polarity from each other, in which
a gate terminal of this MOS transistor and a drain terminal are commonly connected together and form a commonly connecting part, wherein
a constant current is supplied to the commonly connecting part, and
the reference voltage is generated in the commonly connecting part.

* * * * *